United States Patent
Sun et al.

(10) Patent No.: US 6,203,608 B1
(45) Date of Patent: Mar. 20, 2001

(54) FERROELECTRIC THIN FILMS AND SOLUTIONS: COMPOSITIONS

(75) Inventors: Shan Sun; Thomas Domokos Hadnagy; Tom E. Davenport, all of Colorado Springs, CO (US); Hiroto Uchida, Saitama (JP); Tsutomu Atsuki, Saitama (JP); Gakuji Uozumi, Saitama (JP); Kensuke Kegeyama, Saitama (JP); Katsumi Ogi, Saitama (JP)

(73) Assignees: Ramtron International Corporation, Colorado Springs, CO (US); Mitsubishi Materials Corporation, Saitama (JP)

( * ) Notice: Subject to any disclaimer, the term of this patent is extended or adjusted under 35 U.S.C. 154(b) by 0 days.

(21) Appl. No.: 09/061,362

(22) Filed: Apr. 15, 1998

(51) Int. Cl.$^7$ ............................. C09K 3/00; C04B 30/01

(52) U.S. Cl. ................... 106/287.19; 501/136; 252/62.9

(58) Field of Search ..................... 106/287.19; 252/62.9; 501/136

(56) References Cited

U.S. PATENT DOCUMENTS

| | | |
|---|---|---|
| 2,911,370 | 11/1959 | Kulcsar . |
| 3,179,594 | 4/1965 | Kulcsar et al. . |
| 4,124,671 | 11/1978 | Walker et al. . |
| 4,626,369 | 12/1986 | Walker, Jr. . |
| 5,104,690 | 4/1992 | Greenwald . |
| 5,112,433 | 5/1992 | Dawson et al. . |
| 5,244,742 * | 9/1993 | Ogi et al. ............................. 428/469 |
| 5,281,888 | 1/1994 | Takeuchi et al. . |
| 5,337,279 | 8/1994 | Gregory et al. . |
| 5,338,999 | 8/1994 | Ramakrishnan et al. . |
| 5,376,857 | 12/1994 | Takeuchi et al. . |
| 5,378,382 | 1/1995 | Nichimura et al. . |

FOREIGN PATENT DOCUMENTS

| | | |
|---|---|---|
| 600303 | 6/1994 | (EP) . |
| 2-94507 | 4/1990 | (JP) . |
| 4019911 | 1/1992 | (JP) . |

OTHER PUBLICATIONS

Kulcsar, F., "Electromechanical Properties of Lead Titanate Zirconate Ceramics with Lead Partially Replaced by Calcium of Strontium," Journal of the American Ceramic Society,(Jan. 1959), pp. 49–51, Westerville, Ohio.

Jaffe, B., et al., "Piezoelectric Ceramics,"(1971,)Academic Press, New York, New York, pp. (no month provided).

Atkin, R.B., "Performance of Sputtered $Pb_{0.92}$ $Bi_{0.07}$ $La_{0.01}(Fe_{0.0405}Nb_{0.325}Zr_{0.27})O_3$ Ferroelectric Memory Films," Ferroelectrics(1972,)vol. 3 pp. 213–215, Norwich, England (no month provided).

Sharma, B.S., et al., "Retention in Thin Ferroelectric Films," Ferroelectrics(1973,)vol. 5, pp. 69–75, Norwich, England (no month provided).

Mehta, R.R., et al., "Depolarization Fields in Thin Ferroelectric Films," Journal of Applied Physics, vol. 44, No. 8, (Aug. 1973,)pp. 3379–3385, Woodbury, New York.

Yamaka, E., et al., "Structural, Ferroelectric, and Pyroelectric Properties of Highly C–Axis Oriented $Pb_{1-x}$ $Ca_x$ $TiO_3$ Thin Film Grown by Radio–Frequency Magnetron Sputtering," Journal of Vacuum Science Technology.(Sep./Oct. 1988,)pp. 2921–2928. College Park, Maryland.

Shepherd, W.H., "Fatigue and Aging in Sol–Gel Derived PZT Thin Films," Materials Research Society Symposium Proceedings vol. 200, 1990, pp. 277–289, Pittsburgh, Pennsylvania (no month provided).

Abt. N., "Electrical Measurements of Ferroelectric Capacitors for Non–Volatile Memory Applications," Materials Research Society Symposium Proceedings vol. 200, 1990, pp. 303–312, Pittsburgh, Pennsylvania (no month provided).

Kulkarni, J., et al., "Ageing of Volatile and Non–Volatile Components of the Remnant Polarization in PZT," Proceedings of the International Symposium on Integrated Ferroelectrics (1992), pp. 363–369, National Semiconductor Corp., Santa Clara, California (no month provided).

Huffman, M., et al., "Morphology and Electrical Characterization of Calcium Modified Ferroelectric Lead Zirconate Titanate Films," Ferroelectrics, 1993, v. 143, n. 1/4, pp. 251–262, Norwich, England.

Dat, R., et al., "Imprint Testing of Ferroelectric Capacitors Used for Non–Volatile Memories," Integrated Ferroelectrics, 1994, vol. 5 pp., 275–286, Amsterdam B.V. (no month provided).

Evans, J.T. Jr., et al., "The Imprint Mechanism in Ferroelectric Capacitors," Proceedings of the International Symposium on Integrated Ferroelectrics (1995), Radiant Technologies, Inc., Albuquerque, New Mexico (no month provided).

(List continued on next page.)

Primary Examiner—David Brunsman
(74) Attorney, Agent, or Firm—Hogan & Hartson, LLP; Peter J. Meza, Esq.

(57) ABSTRACT

The ferroelectric thin film is formed from a liquid composition by the sol-gel processing which has a large amount of polarization, remarkably improved retention and imprint characteristics as compared with a PZT, minute grains and fine film quality, homogeneous electrical properties, and low leakage currents and which is suited for nonvolatile memories. The ferroelectric thin film of the present invention comprising a metal oxide represented by the general formula: $(Pb_v\ Ca_w\ Sr_X\ La_Y)(Zr_Z\ Ti_{1-Z})O_3$, wherein $0.9 \leq V \leq 1.3$, $0 \leq W \leq 0.1$, $0 \leq X \leq 0.1$, $0 < Y \leq 0.1$, $0 < Z \leq 0.9$ and at least either of W and X is not 0, is formed from a solution where thermally decomposable organometallic compounds of respective metals constituting said metal oxide, hydrolyzable organometallic compounds thereof, and partially hydrolyzed products and/or polycondensation products of said hydrolyzable organometallic compounds are dissolved in an organic solvent in such a proportion as to provide the metal atom ratio represented by the above-mentioned formula.

10 Claims, 2 Drawing Sheets

OTHER PUBLICATIONS

Lee, J., et al., "Imprint of (Pb,La)(Zr,Ti)$O_3$ Thin Films With Various Crystalline Qualities," Applied Physics Letter, vol. 68, No. 4(Jan. 22, 1996), Woodbury, New York.

D. Hadnagy, et al., "Addition of Ca and Sr in PLZT to Improve FRAM® Performance and Reliability", abstract and overhead presentation,(Mar. 1, 1998,)10th International Symposium on Integrated Ferroelectrics, Monterey, California.

* cited by examiner

FERROELECTRIC THIN FILMS AND SOLUTIONS: COMPOSITIONS

FIELD OF THE INVENTION

This invention relates to solution compositions for the formation of novel ferroelectric thin films having perovskite crystal structures. More specifically, it relates to a solution composition capable of forming a ferroelectric thin film which has characteristics particularly suited for a nonvolatile memory such as minute grains, fine film quality, low leakage currents, and excellent resistance to polarization fatigue and which can be utilized in a variety of uses as ferroelectric thin films, a method for forming a ferroelectric thin film using the same, a ferroelectric thin film formed, and utilities thereof.

BACKGROUND OF THE INVENTION

For information storage in electronic devices, at present DRAMs, which are semiconductor memories, are mainly used. However, they require refresh cycles at certain periods due to their gradual loss of memory from leakage of current. Further, they consume electric power, presenting environmental problems. Thus, attention is being paid to ferroelectric random access memories, which are nonvolatile memories (with no memory loss) not requiring refresh cycles.

Ferroelectric random access memory is derived from DRAM by substituting its capacitor portion consisting of silicon oxide with a ferroelectric thin film and utilizes a phenomenon in which spontaneous polarization of the ferroelectric thin film can be switched between two different remnant polarization states by applying an electric field. Because the state of the remnant polarization is maintained after removal of the electric field, it makes up a nonvolatile memory. Besides being nonvolatile in memory and capable of random access, a ferroelectric random access memory is provided with merits such as lower write voltage, higher-speed write capability, less consumption of electric power, a greater number of write-erase cycles and higher compatibility with DRAM than EEPROM and flash memories, which are conventional nonvolatile memories. Ferroelectric random access memories possess the most advantageous characteristics for information storage among the presently known nonvolatile memories.

Ferroelectric raw materials for use in ferroelectric random access memories require characteristics such as large amounts of polarization (switched charge amounts), small dielectric constants, good resistance to polarization fatigue, good memory retention, high speed in polarization switching, and low leakage currents.

A representative example of ferroelectric materials that have been used for ferroelectric random access memories is PZT (a solid solution of lead titanate and lead zirconate represented by the formula Pb(Zr, Ti)O$_3$), which has a large amount of polarization and a relatively small dielectric constant. Although SrBi$_2$Ta$_2$O$_3$ (SBT) having excellent polarization fatigue characteristics is known, it suffers from the drawback that it requires a high processing temperature exceeding 700° C. and has a small amount of polarization.

Generally, methods for forming oxide thin films of composite are classified as vapor phase methods such as sputtering and CVD, and liquid phase methods such as the sol-gel processing. A PZT thin film can be formed by one of these methods. The vapor phase methods can form uniform films, but devices therefor are costly and generally suffer from low productivity. Additionally, in the CVD method the film composition is likely to vary, thus also causing the problem that the film characteristics are unstable. For sol-gel processing, it is easy to control the film composition, but difficult to form a uniform film because the film tends to powder. In this regard, Japanese Patent Laid Open No. 4-19911 describes that where the thin films of PZT or the like are formed by the sol-gel processing, uniform thin films can be obtained if a stabilizer such as a β-diketone is added to coating solutions.

PZT is very advantageous as a ferroelectric raw material for use in a nonvolatile memory in that it has a large amount of polarization which is the most fundamental requirement for ferroelectric random access memory, or nonvolatile ferroelectric memory. However, thin films made of such materials experience the problems that they are susceptible to polarization fatigue (a decrease in the amount of polarization as the result of having been subjected to repeated polarization inversions) and their resistance to the polarization fatigue (also simply referred to as "fatigue characteristic") is insufficient. A poor fatigue characteristic shortens the life of a RAM, which results in limited utility.

Another problem with a PZT is that its memory retention and imprint characteristics are insufficient. The retention characteristic is that which reflects the degree of retention of the data written into a memory in the operating environment. The imprint characteristic is that which shows the degree of deterioration of a ferroelectric thin film in the operating environment by virtue of voltage stress, pulse, polarization inversion, temperature or the like. These characteristics also heavily influence the usable life of a ferroelectric random access memory.

SUMMARY OF THE INVENTION

The present invention provides a solution composition for forming a ferroelectric thin film that solves the above-mentioned problems inherent in PZT thin films and that is suited for a ferroelectric random access memory according to the sol-gel processing or similar methods and also provides a thin film formed therefrom. Specifically, it is the object of this invention to provide a solution composition capable of forming a ferroelectric thin film through the sol-gel processing or the like, which has a large amount of polarization; remarkably improved fatigue, retention and imprint characteristics compared with PZTs, minute grains and fine film quality; homogeneous electrical properties over the entire substrate, and low leakage currents, as well as to provide a ferroelectric thin film formed therefrom.

According to this invention, the above-mentioned object can be attained with a solution composition for the formation of a ferroelectric thin film comprising a metal oxide represented by the general formula

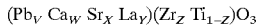
(Pb$_V$ Ca$_W$ Sr$_X$ La$_Y$)(Zr$_Z$ Ti$_{1-Z}$)O$_3$ wherein $0.9 \leq V \leq 1.3$, $0 \leq W \leq 0.1$, $0 \leq X \leq 0.1$, $0 < Y \leq 0.1$, $0 < Z \leq 0.9$ and at least either of W and X is not 0. The composition comprises a solution in which thermally decomposable organometallic compounds of respective metals constituting said metal oxide, hydrolyzable organometallic compounds thereof, and partially hydrolyzed products and/or polycondensation products of said hydrolyzable organometallic compounds are dissolved in an organic solvent in such a proportion as to provide the metal atom ratio represented by said formula. As used herein, the term "solution" means not only a genuine solution, but also a colloidal solution, i.e. a sol, inclusively.

A preferred method of forming a ferroelectric thin film from the aforementioned solution composition comprises the steps of coating the solution composition on a substrate, heating the coated substrate in an oxidative and/or steam-containing or inert atmosphere to form the thin film of a metal oxide with amorphous structure on the substrate, and subjecting the substrate with amorphous structure to heat treatment at a temperature below 700° C. to crystallize the thin film of said metal oxide, and if desired, it repeats the coating and heating steps or the coating, heating, and crystallizing steps until the thin film reaches to a desired thickness. According to this invention, there are also provided a ferroelectric film formed from the above-mentioned solution solution, a nonvolatile memory and a capacitor film both equipped with this ferroelectric thin film.

DETAILED DESCRIPTION OF THE INVENTION

Figure 1:
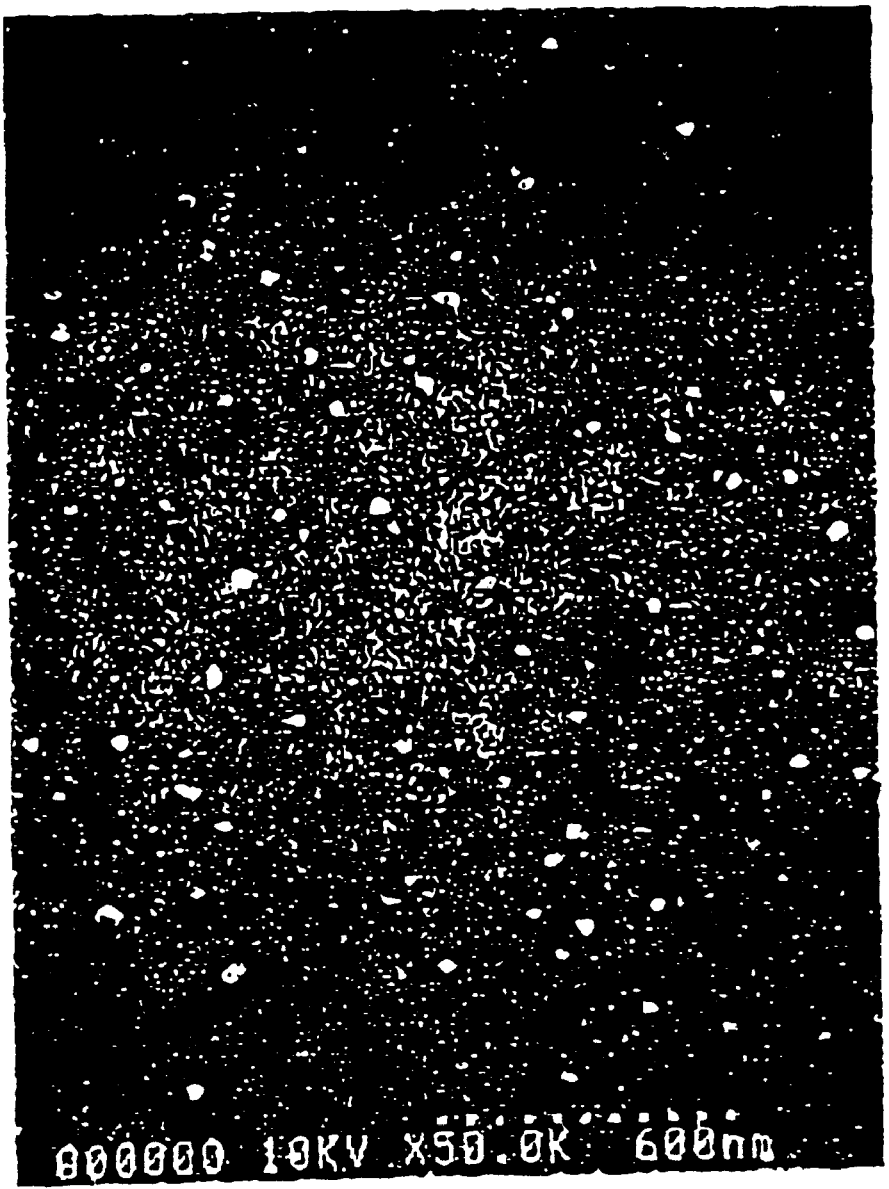
FIG. 1 shows a surface SEM photograph of a La, Ca, Sr doped PZT thin film formed by the sol-gel processing from the solution composition according to this invention.

According to this invention, a ferroelectric thin film comprising a metal oxide represented by the general formula:

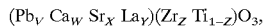

$(Pb_V Ca_W Sr_X La_Y)(Zr_Z Ti_{1-Z})O_3$, wherein $0.9 \leq V \leq 1.3$, $0 \leq W \leq 0.1$, $0 \leq X \leq 0.1$, $0 < Y \leq 0.1$, $0 < Z \leq 0.9$ and at least either of W and X is not 0, is formed by the sol-gel processing or similar methods. Although in this general formula the atomic ratio of the oxygen atom is set at 3, it may vary from 3 since in reality, a part of Pb, which is divalent, is substituted by trivalent La. Thus, "about 3" is more accurate, but as a matter of convenience it has been set at 3.

The metal oxide as represented by the above-mentioned general formula has a composition that is derived from a PZT base composition to which either or both of Ca and Sr together with La are added (or doped). The ferroelectric material where La is added to PZT is well known as PLZT. However, it has not been reported that the ferroelectric material to which Ca and/or Sr is further added, possesses such characteristics as will be suited to a nonvolatile memory for ferroelectric random access memory.

In the above-mentioned composition preferable atomic ratios for respective metals are as follows:

V is preferably 1.0 to 1.25, and more preferably 1.05 to 1.20;

W is preferably 0.01 to 0.08, more preferably 0.03 to 0.07, and most preferably 0.04 to 0.06;

X is preferably 0 to 0.08, more preferably 0 to 0.05, and most preferably 0 to 0.03;

Y is preferably 0.01 to 0.06, more preferably 0.01 to 0.04, and most preferably 0.01 to 0.02; and Z is preferably 0.1 to 0.8, more preferably 0.2 to 0.6, and most preferably 0.35 to 0.5.

The solution composition that is used to form a thin film of the ferroelectric material comprising this metal oxide is a solution wherein thermally decomposable organometallic compounds of respective metals constituting said metal oxide, hydrolyzable organometallic compounds thereof, and partially hydrolyzed products and/or polycondensation products of said hydrolyzable organometallic compounds are dissolved in an organic solvent in such a proportion as to provide the metal atom ratio represented by the above-mentioned formula, which is similar to the cases of the conventional sol-gel processing or other methods.

The thermally decomposable or hydrolyzable organometallic compounds are preferably compounds whose organic radicals are bound to the metals through oxygen atoms or nitrogen atoms thereof. Named as representative examples of these organometallic compounds are metal alkoxides, metal carboxylates, metal β-diketonato complexes, metal β-diketoester complexes, β-iminoketo complexes, and metal amino complexes. Among these, since the metal alkoxides are hydrolyzable compounds, they undergo polycondensation and metal-oxygen-metal (M-O-M) bonds are formed during condensation reactions. Most of the remaining compounds are thermally decomposable and when heated in an oxygen, steam-containing or inert atmosphere, they change into metal oxides.

Some examples of the organometallic compounds that can be used in this invention will be shown below; however these are only illustrative and other compounds may be used as long as they are hydrolyzable or thermally decomposable.

Examples of the metal alkoxides are an ethoxide, a propoxide, an isopropoxide, a n-butoxide, an isobutoxide, a t-butoxide, a 2-methoxyethoxide, a 2-methoxypropoxide, a 2-ethoxypropoxide, etc. Illustrated as metal carboxylates are an acetate, a propionate, a butyrate, a 2-ethylhexanoate, octylate, etc.

The metal β-diketonato complexes are complexes where β-diketones coordinate to metals. Illustrated as β-diketones are acetylacetone, trifluoroacetylacetone, hexafluoroacetylacetone, dipivaloylmethane, etc. Examples of β-diketoesters that are ligands of the β-diketoester complexes are the methyl ester, ethyl ester, propyl ester, butyl ester of acetoacetic acid, etc. The metal β-imino keto complexes are complexes where β-iminoketones coordinate to metals. Named as examples of β-iminoketones are aminopenten-2-one, 1,1,1,5,5,5-hexamethylaminopenten-2-one, etc. The metal amino complexes are complexes where multivalent amines coordinate to metals. Representative examples of the multivalent amines are ethylenediamine and ethylenediaminetetraacetic acid (EDTA).

For each metal component constituting the metal oxide of the formula as described above, organometallic compounds that serve as its supply materials are to be selected. Preferably, the organometallic compounds to be used are those which are soluble in organic solvents and change into metal oxides at a temperature below 500° C. in an oxidative and/or steam-containing or inert atmosphere. Further, the organometallic compounds may contain more than one kind of metals. In other words, a single organometallic compound may sometimes serve as a supply source for plural metals. At least one kind of organometallic compounds that are hydrolyzable is preferably used as the raw material. As the raw organometallic compounds, high purity ones should preferably be used as much as possible, and if necessary, they are purified prior to use. Their purification can be carried out by re-crystallization, distillation, sublimation, chromatography, etc.

In general, with respect to organolead compounds that supply Pb, carboxylic acids are preferably used. For the organometallic compounds that serve as a supply source for Ca, Sr, and La, carboxylic acids or alkoxides of these metals are preferably used. With respect to the organometallic compounds that serve as a supply source for Zr and Ti, alkoxides of these metals or various kinds of the complexes as described above are preferably used.

The raw organometallic compounds of respective metals are weighed so that they may be present in proportions that will provide the metal atom ratio as represented by the above-mentioned formula; dissolved in a suitable organic solvent; if desired, partially hydrolyzed (i.e., incompletely) and/or polycondensed, and then used for forming the ferroelectric thin film.

Furthermore, the raw organometallic compounds can be generated in situ. Namely, precursors of the raw material compounds that generate the raw organometallic compounds upon dissolving in organic solvents are to be used. For example, it is possible to generate a metal alkoxide in situ by dissolving a simple metal substance (e.g., metal strontium) in an alcohol or to generate a metal complex in situ by dissolving a simple metal substance in a solvent containing ligands of the above-mentioned complexes.

The solvent is not particularly limited as long as it can dissolve the raw organometallic compounds, and in general, it is a polar solvent such as alcohol, ester, ketone, and alkanolamine. A solvent whose boiling point (the boiling point at standard pressure is meant hereinbelow) is not less than 100° C. is preferably used. This allows water derived from the raw materials to be removed by azeotropic distillation and the solution to be dehydrated easily, as will be described later. The most preferred solvent includes alkoxyalcohol type solvents such as 2-methoxyethanol, 2-methoxypropanol, and 2-ethoxypropanol; and alkanolamine type solvents such as monoethanolamine and diethanolamine. This kind of solvents has the function of strong salvation toward the raw organometallic compounds and thus excellent dissolving power thereto.

The methods of preparing the solution, although not particularly limited, will be explained hereinbelow by some of their examples.

First, among the raw organometallic compounds, those of the carboxylate type with crystallization water in general are dissolved in a suitable organic solvent having its boiling point not less than 100° C. The resulting solution is distilled to remove water derived from crystallization water of the raw materials by azeotropic distillation, achieving dehydration of the solution. Where the solution still contains the crystallization water of the raw material compounds, hydrolysis or polycondensation proceeds to cause precipitation in some instances when the solution is later heated, concentrated to effect complexation of the metallic compounds. Dehydration of the solution can also be carried out using an inert dehydrating agent. When the remaining raw organometallic compounds of the alkoxide and/or complex type are added and dissolved in the solution having undergone the dehydration, a solution containing the respective raw organometallic compounds (hereinbelow also referred to as "raw material solution") is obtained.

This raw material solution may be used in the formation of a ferroelectric thin film as such, but preferably it is further heated and concentrated to effect the intended complexation of the metallic compounds in the solution. As used herein, the term "complexation" means that many kinds of organometallic compounds present in the solution are allowed to bind through M—O—M' bonds. One example of such reaction is illustrated by the reaction scheme in the following.

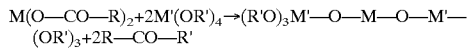

By this complexation, lead compounds having relatively large volatility, for example, bind to other compounds, thus preventing them from volatilizing away during heating at the time of film formation and capable of forming uniform thin films with no compositional variations. The heating temperature employed then is not particularly limited as long as it accomplishes the complexation, but the range of 100 to 160° C. is ordinarily appropriate. Subsequently, if necessary a solvent is added to adjust the solution concentrations to be suitable for coating. In general, the concentration of the raw material solution for use in coating is preferably in the range of 2 to 15% by weight based on a concentration as converted into the metal oxide represented by the above-mentioned general formula.

In cases where the raw organometallic compounds only consist of metal carboxylates and/or metal alkoxides (namely, they contain no metal complexes), it is preferred to add a stabilizer to the solution in a ratio of 0.2 to 3 mol per one mol of the total amount of metals in the solution: the stabilizer selected from the group consisting of a β-diketone, a βketonic acid, a β-keto ester, an oxy-acid, a diol, a higher carboxylic acid, an alkanolamine, and a polyamine.

The addition timing of the stabilizer is not particularly limited, but where the complexation of the metallic compounds is carried out by heating and concentrating, the addition should preferably be done thereafter so that the stabilizer may not be lost during this concentrating period. After the stabilizer has been added to the solution, the solution is heated in order for the stabilizer to react with the raw material compounds.

Any of these compounds to be used as a stabilizer has the capability of forming a complex and is able to cause each of the raw material metallic compounds to be in a loose polymerization state in its entirety through a metal-oxygen-metal or metal-nitrogen-metal bond. As a result, similarly to the above-mentioned complexation, the volatilization of only a part of the metallic compounds during heating at the time of film formation is prevented and uniform thin films can easily be formed. The storage stability of the solution also improves, which prolongs the potential storage period without causing any precipitation. If the addition amount of the stabilizer is too small, hardly any effects can be obtained and too much addition may impede the hydrolysis of the raw material compounds and cause precipitation.

Among compounds useful for the stabilizer, β-diketones, β-keto esters, alkanolamines, and polyamines may be similar to those which are used as ligands to form metal complexes that are the raw material compounds. A representative example of β-ketonic acids is acetoacetic acid. Oxy-acids are aliphatic compounds having a hydroxyl group and carboxylic acid group and, for example, are glycolic acid, lactic acid, tartaric acid, citric acid, etc. Illustrated as examples of diols are ethyleneglycol, propyleneglycol, etc.

In cases where the raw organometallic compound contains, for example, a metal complex such as β-diketonato, ligands of this complex can fulfill functions similar to those of the above-mentioned stabilizer and therefore, addition of the stabilizer is unnecessary, although it is possible to add its small amount.

In cases where the hydrolyzable organometallic compounds in the raw material solution require to be partially hydrolyzed, the hydrolysis is forced to proceed by adding a small amount of water to the solution followed by heating. Once the raw material compounds have been partially hydrolyzed, the wettability of the solution to a substrate is improved. The addition amount of water may, for example, be in a ratio of 0.1 to 0.3 mole per one mole of the total amount of metals in the solution. Occasionally, a small amount of acid (i.e., acetic acid and formic acid) may be added. As the hydrolysis advances, hydrolyzed products partially undergo polycondensation, forming a sol. Since the hydrolysis and polycondensation need to proceed incompletely within the limits of causing no gelation (i.e., precipitation of polycondensation products), the addition amount of water, temperature, reaction times, etc. may be adjusted accordingly.

After coating a substrate with the thus prepared solution composition (the raw material solution) according to this invention, the substrate is heated in an oxidizing and/or steam-containing or inert atmosphere, the thin film of a metal oxide is formed on the substrate, the substrate is subjected to heat treatment at a temperature above the crystallization temperature of said metal oxide and the thin film of said metal oxide is crystallized; thereby, the ferroelectric thin film can be formed. The coating and heating steps or the coating, heating, and crystallizing steps may be repeated until the thin film reaches to the desired thickness.

The substrate may be selected appropriately depending on the use of the ferroelectric thin film, but it needs to be prepared from a heat-resistant material that endures heating during the heating and heat treatment steps. For example, the substrate can be composed of a semiconductor such as silicon, ceramics, a metal or a combination of these materials. It is well known that if necessary, the substrate is provided with elements such as a transistor, electrodes, internal wiring, etc.

The coating is ordinarily carried out by the spin coat method, but is not limited thereto. After coating, the coated film may be, for example, dried at a temperature of 100 to 150° C. to evaporate solvents from the thin film. Subsequently, the coated substrate is heated in an oxidative and/or steam-containing atmosphere and the organometallic compounds constituting the coated film are thermally decomposed completely. An atmosphere containing both of oxygen and steam suffices for the heating atmosphere. This heating temperature is preferably set not more than 500° C. so as not to damage electrodes, substrates and so on. Preferred heating temperatures are 260 to 500° C.

Through this heating, a thin film comprising the metal oxide is formed on the substrate; however, the metal oxide as such does not completely possess a crystal structure of the perovskite type and is amorphous at least in part. In order to have the film function as a ferroelectric thin film; it is necessary to completely crystallize the whole film. Therefore, the substrate is further subjected to heat treatment at a temperature in the range of 450 to 700° C. Since this heat treatment only requires thermal energy, heat treatment atmosphere is not particularly limited; however, heat treatment is preferably carried out in an oxidizing atmosphere in order to prevent oxygen vacancy defects of the metal oxide from being generated during the heat treatment. For example, the heat treatment may be carried out in an atmosphere of pure oxygen.

Furthermore, the heating and heat treatment as described above can be carried out successively under the same atmosphere. Also, it is possible to omit the heating step and to accomplish the conversion to the metal oxide thin film and its crystallization at the same time in the heat treatment step; however, this is not preferable because a smooth thin film does not tend to be formed.

In cases where a single coating does not form a thin film of the desired thickness, the coating and heating steps or the coating, heating, and crystallizing steps are repeated until the thin film of the desired thickness is obtained. The former process is more efficient since it requires heat treatment only once. In the case of a ferroelectric random access memory, the film thickness of a ferroelectric thin film is normally within the range of 1000 to 3000 Å.

When the ferroelectric thin film formed from the solution composition according to this invention is compared with a ferroelectric thin film comprising the metal oxide that has the same composition and formed by sputtering, it has minute grains, fine film quality in addition to small variations in the film thickness depending on sites of the substrate and thus it has a merit of smaller fluctuations in the electrical properties. As compared with conventional PZT compositions, PZT thin films formed by the same sol-gel processing can constitute a ferroelectric random access memory that has low leakage currents and is excellent in any of polarization fatigue, retention and imprint characteristics.

This ferroelectric thin film takes up a crystal structure of the perovskite type, and in order for the film to have large polarization, its <111> orientation is preferably over 70% in volume fractions. This degree of crystallographic orientation can be controlled by the type of an undercoat for the ferroelectric thin film (which is a lower electrode in the case of a capacitor), heating during film formation, heat treatment conditions for crystallization, and the like.

The ferroelectric thin film according to this invention can constitute a capacitor that has excellent fatigue characteristics and low leakage currents if appropriate electrodes are formed thereon or thereunder: these electrodes include a platinum electrode such Pt or Pt/Ti and an oxide electrode such as ruthenium oxide or iridium oxide. If a ferroelectric random access memory which is a nonvolatile memory, is prepared from this capacitor, a ferroelectric random access memory having excellent retention and imprint characteristics can be obtained. For example, the ferroelectric random access memory may be any of the following types: a 2T/2C (two transistor/two capacitor) type without a reference cell, 1T/1C (one transistor/one capacitor) type with a reference cell and MFSFET (metal ferro-silicon field effect transistor) type wherein a ferroelectric thin film is formed directly on a silicon substrate.

Other than for ferroelectric random access memories, this capacitor is useful as a DRAM capacitor or a capacitor for a GaAs IC bias condenser and a chip-type multi-layer ceramic condenser, for example. Besides capacitors, the ferroelectric thin film according to this invention can be applied to laser modulation elements, optical shutters, oscillation elements, piezoelectric filters, infrared sensors, etc.

This invention is illustrated by the following examples; however, it is not to be limited to these examples.

EXAMPLE 1

This example illustrates a raw material solution for forming a PZT ferroelectric thin film doped with Ca, Sr, and La having the composition represented by $Pb_{1.10}Ca_{0.05}Sr_{0.02}La_{0.03}Zr_{0.40}Ti_{0.60}$ $O_3$, as well as a film-processing procedure therefor.

Lead acetate trihydrate 17.78 g, calcium acetate monohydrate 0.38 g, and lanthanum acetate 1.5 hydrate 0.45 g were dissolved in 45 g of 2-methoxyethanol and water derived from water of crystallization was removed by azeotropic distillation to dehydrate the solution. Then, 7.46 g of a solution (1% by weight concentration) dissolving each of zirconium tetra-n-butoxide 7.74 g, titanium tetra-isopropoxide 7.40 g, and metallic strontium in 2-methoxyethanol was added to the above-mentioned solution in sequence and thereafter, heated at 150° C. for 2 h to complex the raw metallic compounds each other. Subsequently, to the solution was added 8.56 g of acetylacetone (2 mol per one mol of the total amount of metals) as a stabilizer and heated under reflux at 140° C. for 1.5 h to react the stabilizer with the metallic compounds. After cooling, 2-methoxyethanol was added to prepare 100 g of a raw material solution having a 15% by weight concentration as converted to the above-mentioned compositional formula and forming the ferroelectric thin film as represented by the above-mentioned compositional formula.

A portion of this raw material solution was concentrated to obtain a gelled sample, which was used to perform a TG-DTA analysis in an oxidizing atmosphere. It was confirmed that the decomposition of this sample was completed below 420° C. Namely, all the raw organometallic compounds are converted into metal oxides below or equal to this temperature. In addition, although another portion of this raw material solution was allowed to stand at room temperature for one month, no formation of precipitates was visually recognized.

Employing the above-mentioned raw material solution, coating was carried out by the spin coat method on a platinum bottom electrode which had been formed all over a 6-inch silicon wafer by sputtering. After initially heating the already coated wafer at 150° C. for 1 min in the air to dry the coated film, heating continued at 400° C. for 10 min. As the results from the above-mentioned TG-DTA analysis indicate, the raw material compounds in the coated film almost all decompose during this heating, forming a thin film of metal oxides which hardly contains any organic compounds. After repeating this coating and heating three times, the wafer was finally subjected to heat treatment at 600° C. for 1 hour in oxygen for the purpose of crystallization of the thin film, which resulted in the film formation of a ferroelectric thin film.

Measurements by X-ray diffraction ascertained that not less than 70% of volume fractions of the film formed had the crystal structure of the perovskite type with the <111> orientation. The orientation was determined by using the <222> peak because the undercoat platinum also took up the <111> orientation and, as a result, the peak of platinum overlapped at the <111> position in the X-ray diffraction chart.

An EPMA analysis of the composition of the film ascertained that it was identical with the composition of the solution. Film thickness at various points on the wafer was measured by cross sectional SEM photography. The film thickness was greater at the central part than at the edge part. The thickness averaged 2500 Å and variations were small and within 3%. Furthermore, the surface of the film, after its etching, was observed under a SEM: the grains were minute, as their mean particle radius was 1000 Å; further, the grain size was uniform and the film quality was fine. One example of these SEM photographs is shown in FIG. 1. This minute, fine and uniform structure allows the electrical properties of the whole film to be homogeneous, as will be illustrated below.

A platinum coating was formed by sputtering on the ferroelectric film coated and it was patterned by photolithography and ion-etching to prepare an upper platinum electrode. Subsequently, after heating at 650° C. for 30 min in oxygen, the electrical properties were measured. The results as described below were obtained in not less than 90% of all samples:

| | |
|---|---|
| Fatigue at 5V Start: | $3 \times 10^7$ to $1 \times 10^8$ cycles |
| Leakage Current at 5V: | 0.4 to 4 $\mu A/cm^2$ |
| Retention Characteristics | |
| $Q_{SS}$ post 150° C. baking for 88 hours: | 13.5 $\mu C$ |
| $Q_{SS}$ rate: | −1.6% |
| Imprint Characteristics | |
| $Q_{OS}$ post 150° C. baking for 88 hours: | 17.14 $\mu C$ |
| $Q_{OS}$ rate: | −5.23% |

As used herein, the term "fatigue start" means the number of polarization switching cycles at which a decrease in the amount of remnant polarization begins during polarization switching. The polarization switching was induced with bipolar continuous waves (±5 V, 625 kHz). The leakage current represents the maximum values obtained when a+5 V DC voltage was applied.

$Q_{SS}$ and $Q_{OS}$ are calculated by the method as described in S. D. Traynor et al., Integrated Ferroelectrics, 1997, Vol. 16 pp. 63–76. $Q_{SS}$ rate and $Q_{os}$ rate represent lowering rates that were calculated from the slopes of straight lines which were obtained by plotting respective $Q_{SS}$ and $Q_{OS}$ values against the time axis on the natural log scale in cases where the samples were baked at 150° C.

The $Q_{SS}$ and $Q_{SS}$ rate prove to be indices of evaluating the memory retention characteristic of a ferroelectric random access memory. The larger $Q_{SS}$ is and the smaller $Q_{SS}$ rate is, excellent retention characteristics are noted. Likewise, the $Q_{OS}$ and $Q_{OS}$ rate prove to be indices of evaluating the imprint characteristic of a ferroelectric random access memory. The larger $Q_{OS}$ is and the smaller $Q_{OS}$ rate is, excellent imprint characteristics are noted.

Further, although lanthanum acetate was used as a lanthanum raw material in this example, lanthanum octylate or lanthanum 2-methoxyethoxide was also used to prepare a raw material solution, which results in the formation of a ferroelectric thin film having electrical properties similar to those described above.

In addition, when the electrode is changed from a platinum electrode to an oxide electrode made of ruthenium oxide or iridium oxide, the number of polarization to turn into the fatigue start increases to be on the order of $10^{12}$ at the maximum, thus more improving the polarization fatigue characteristic.

EXAMPLE 2

This example illustrates a raw material solution for forming a PZT ferroelectric thin film doped with Ca and La having the composition represented by $Pb_{1.176}Ca_{0.048}La_{0.016}Zr_{0.417}Ti_{0.583}O_3$, as well as a film-processing procedure therefor.

In a similar manner to the procedure of Example 1, except that strontium was not added and the amount of each raw material compound other than strontium was changed so as to produce the above-mentioned composition, 100 g of a raw material solution for processing the ferroelectric thin film was prepared.

A portion of this raw material solution was concentrated to obtain a gelled sample, which was used to perform the TG-DTA analysis in an oxidative atmosphere. It was confirmed that the decomposition of this sample was completed not more than 420° C. In addition, although another portion of this raw material solution was allowed to stand at room temperature for one month, no formation of precipitates was visually recognized.

Employing the above-mentioned raw material solution, a ferroelectric thin film was formed on a platinum bottom electrode over a silicon wafer similarly to the procedure of Example 1. Measurements by X-ray diffraction ascertained that the film formed had the crystal structure of the perovskite type. An EPMA analysis of the composition of the film also ascertained that it was identical with the composition of the solution. The thickness of the film averaged 2500 Å and variations in the film thickness between the central and edge parts of the wafer were small and within 3%. The surface of the film was observed under a SEM: the grains were minute as their mean grain size was 1000 Å; further, the grain sizes were uniform and the film quality was fine. This minute, fine and uniform structure allows the electrical properties of the whole film to be homogeneous, as will be illustrated below.

The electrical properties were measured similarly to the procedure of Example 1. The results as described below were obtained in not less than 90% of all samples:

| | |
|---|---|
| Fatigue at 5V Start: | $3 \times 10^7$ to $1 \times 10^8$ cycles |
| Leakage Current at 5V: | 0.4 to 4 $\mu$A/cm$^2$ |
| Retention Characteristics | |
| $Q_{SS}$ post 150° C. baking for 88 hours: | 12.0 $\mu$C |
| $Q_{SS}$ rate: | $-2.6\%$ |
| Imprint Characteristics | |
| $Q_{OS}$ post 150° C. baking for 88 hours: | 11.9 $\mu$C |
| $Q_{OS}$ rate: | $-6.7\%$ |

In this case also, when the electrode is changed from a platinum electrode to an oxide electrode of ruthenium oxide or iridium oxide, the polarization fatigue characteristic is more improved as in Example 1.

EXAMPLE 3

This example illustrates a raw material solution for forming a PZT ferroelectric thin film doped with Sr and La having the composition represented by $Pb_{1.064}Sr_{0.03}La_{0.013}Zr_{0.444}Ti_{0.556}O_3$, as well as a film-forming procedure therefor.

In a similar manner to the procedure of Example 1, except that calcium acetate monohydrate was not added and the amount of each of the other raw material compounds was changed so as to produce the above-mentioned composition, 100 g of a raw material solution for forming the ferroelectric thin film was prepared.

A portion of this raw material solution was concentrated to obtain a gelled sample, which was used to perform the TG-DTA analysis in an oxidative atmosphere. It was confirmed that the decomposition of this sample was completed not more than 420° C. In addition, although another portion of this raw material solution was allowed to stand at room temperature for one month, no formation of precipitates was visually recognized.

Employing the above-mentioned raw material solution, a ferroelectric thin film was formed on a platinum bottom electrode over a silicon wafer similarly to the procedure of Example 1. Measurements by X-ray diffraction ascertained that the film formed had the crystal structure of the perovskite type. An EPMA analysis of the composition of the film also ascertained that it was identical with the composition of the solution. The thickness of the film averaged 2500 Å and variations in the film thickness between the central and edge parts of the wafer were small and within 3%. The surface of the film was observed under a SEM: the grains were minute as their size was 1000 Å; further, grain sizes were uniform and the film quality was fine. This minute, fine and uniform structure allows the electrical properties of the whole film to be homogeneous, as will be illustrated below.

The electrical properties were measured similarly to the procedure of Example 1. The results as described below were obtained in not less than 90% of all samples:

| | |
|---|---|
| Fatigue at 5V Start: | $3 \times 10^7$ to $1 \times 10^8$ cycles |
| Leakage Current at 5V: | 0.4 to 4 $\mu$A/cm$^2$ |
| Retention Characteristics | |
| $Q_{SS}$ post 150° C. baking for 88 hours: | 15.1 $\mu$C |
| $Q_{SS}$ rate: | 4.0% |
| Imprint Characteristics | |
| $Q_{OS}$ post 150° C. baking for 88 hours: | 1.9 $\mu$C |
| $Q_{OS}$ rate: | $-19.25\%$ |

In this case also, when the electrode is changed from a platinum electrode to an oxide electrode of ruthenium oxide or iridium oxide, the polarization fatigue characteristic is more improved as in Example 1.

Comparative Example 1

This comparative example illustrates a raw material solution for forming a PZT ferroelectric thin film having the composition represented by $Pb_{1.10}Zr_{0.40}Ti_{0.60}O_3$, as well as a film-forming procedure therefor. This composition is identical with the composition used in Example 1 from which the doping elements, Ca, Sr, and La have been removed.

In a similar manner to the procedure of Example 1, except that each of Ca, Sr, and La raw material compounds was not added, an about 15% by weight concentration of a raw material solution was obtained.

Employing this raw material solution, a ferroelectric thin film was formed on a platinum bottom electrode over a silicon wafer similarly to the procedure of Example 1. The surface of the film was observed under a SEM: the grains were relatively coarse as their mean size was 500 Å, but their grain sizes were uniform and the film quality was fine. Thus, the electrical properties were homogeneous over the whole film, as will be illustrated below.

The electrical properties were measured similarly to the procedure of Example 1. The results as described below were obtained in not less than 90% of all samples:

| | |
|---|---|
| Fatigue at 5V Start: | $3 \times 10^3$ to $1 \times 10^4$ cycles |
| Leakage Current at 5V: | 0.4 to 4.0 mA/cm$^2$ |
| Retention Characteristics | |
| $Q_{OS}$ post 150° C. baking for 88 hours: | 16.71 $\mu$C |
| $Q_{OS}$ rate: | $-12.30\%$ |

As compared with Example 1, the fatigue number of times decreased by four digits; the leakage current was large; the $Q_{os}$ was relatively small; and the $Q_{OS}$ rate became more than twice.

Therefore, when a ferroelectric thin film based on PZT doped with Ca, Sr, and La is formed by the sol-gel processing according to this invention, it is realized that the ferroelectric thin film has low leakage currents, markedly excellent polarization fatigue characteristics, and excellent imprint characteristics compared with PZT thin films can be formed.

Comparative Example 2

This comparative example is an example where the ferroelectric thin film doped with Ca, Sr, and La having the same composition as that of Example 1, represented by $Pb_{1.10}Ca_{0.05}Sr_{0.02}La_{0.03}Zr_{0.40}Ti_{0.60}O_3$, is formed by sputtering.

The respective oxides of the component metals were mixed in the same proportion as the above-mentioned composition and calcined to prepare a target. Employing the target, a thin film in a thickness of about 2500 Å having the composition as described above was formed on a platinum lower electrode over a 6-inch silicon wafer. Thereafter, heat treatment was carried out at 600° C. for 1 h in an oxygen atmosphere for the purpose of crystallization of the film, forming the ferroelectric thin film on the electrode.

Figure 2:
FIG. 2 shows a surface SEM photograph of the same La, Ca, and Sr doped PZT thin film as above that was formed by sputtering.

With the resultant film, variations in its film thickness between the central and edge parts of the wafer were on the order of 5%, which prove to be greater compared with those in Examples. The surface of the film was observed under a SEM: similarly to Examples 1–3 the grain were minute as their mean size was 1000 Å; though, their grain sizes were not uniform and the film quality was not fine. One example of these SEM photographs is shown in FIG. 2. Thus, the electrical properties showed some scatters over the whole film, as will be illustrated below.

The electrical properties were measured similarly to the procedure of Example 1. As a result, samples that show the same performance as does Example 1 (as described below) were less than 30% of all the samples in number.

| Fatigue at 5V Start: | $3 \times 10^7$ to $1 \times 10^8$ cycles |
| Leakage Current at 5V: | 0.4 to 4.0 $\mu A/cm^2$ |
| Retention Characteristics | |
| $Q_{SS}$ post 150° C. baking for 88 hours: | 17.14 $\mu C$ |
| $Q_{SS}$ rate: | −5.23% |

In Example 1 where in accordance with this invention the PZT ferroelectric thin film doped with Ca, Sr, and La was formed by the sol-gel processing, not less than 90% samples in number display good electrical properties as described above with few scatters. By contrast, when the same film was formed by sputtering, samples displaying the good electrical properties decreased to less than 30% of all the samples in number and the electrical properties were scattered widely. Accordingly, the yields of products have come to be lowered markedly.

This invention enables the formation of a ferroelectric thin film through the sol-gel processing. The films have markedly small leakage currents; improved polarization fatigue, retention, and imprint characteristics; minute grains and fine film quality; and homogeneous electrical properties over the whole film. Accordingly, the invention enables the preparation of a high performance ferroelectric thin film with high productivity and high yields which is useful for ferroelectric random access memory capacitors or the like.

What is claimed is:

1. A liquid composition for the formation of a ferroelectric thin film comprising:
a metal oxide represented by the general formula

$(Pb_V Ca_W Sr_X La_Y)(Zr_Z Ti_{1-Z})O_3$ wherein $0.9 \leq V \leq 1.3$, $0 \leq W \leq 0.1$, $0 \leq X \leq 0.1$, $0 < Y \leq 0.1$, $0 < Z \leq 0.9$ and at least either of W and X is not 0, said composition comprising a solution wherein thermally decomposable organometallic compounds of respective metals constituting said metal oxide, hydrolyzable organometallic compounds thereof, partially hydrolyzed products and/or polycondensation products of said hydrolyzable organometallic compounds are dissolved in an organic solvent in such a proportion as to provide the metal atom ratio represented by said formula.

2. The liquid composition for the formation of a ferroelectric thin film according to claim 1, wherein the organometallic compound is a compound an organic radical of which is bound to a metal through an oxygen atom or nitrogen atom thereof.

3. The liquid composition for the formation of a ferroelectric thin film according to claim 2, wherein the organometallic compound is selected from the group consisting of a metal alkoxide, a metal carboxylate, a metal β-diketonato complex, a metal β-diketoester complex, a β-iminoketo complex, and a metal amino complex.

4. The liquid composition for the formation of a ferroelectric thin film according to claim 3, wherein the organometallic compound is a compound that changes into a metal oxide at a temperature not more than 500° C.

5. The liquid composition for the formation of a ferroelectric thin film according to claim 3, wherein the organometallic compound is selected from the group consisting of a metal alkoxide and a metal carboxylate, and the solution contains a stabilizer selected from the group consisting of a β-diketone, a β-ketonic acid, a β-keto ester, an oxy-acid, a diol, a higher carboxylic acid, an alkanolamine, and a polyamine in a proportion of 0.2 to 3 mol per one mol of the total amount of metals in said composition.

6. The liquid composition for the formation of a ferroelectric thin film according to claim 2, wherein the organometallic compound is a compound that change into a metal oxide at a temperature not more than 500° C.

7. The liquid composition for the formation of a ferroelectric thin film according to claim 2, wherein the organometallic compound is selected from the group consisting of a metal alkoxide and a metal carboxylate, and the solution contains a stabilizer selected from the group consisting of a β-diketone, a β-ketonic acid, a β-keto ester, an oxy-acid, a diol, a higher carboxylic acid, an alkanolamine, and a polyamine in a proportion of 0.2 to 3 mol per one mol of the total amount of metals in said composition.

8. The liquid composition for the formation of a ferroelectric thin film according to claim 1, wherein the organometallic compound is a compound that changes into a metal oxide at a temperature not more than 500° C.

9. The liquid composition for the formation of a ferroelectric thin film according to claim 4, wherein the organometallic compound is selected from the group consisting of a metal alkoxide and a metal carboxylate, and the solution contains a stabilizer selected from the group consisting of a β-diketone, a β-ketonic acid, a β-keto ester, an oxy-acid, a diol, a higher carboxylic acid, an alkanolamine, and a polyamine in a proportion of 0.2 to 3 mol per one mol of the total amount of metals in said composition.

10. The liquid composition for the formation of a ferroelectric thin film according to claim 1, wherein the organometallic compound is selected from the group consisting of a metal alkoxide and a metal carboxylate, and the solution contains a stabilizer selected from the group consisting of a β-diketone, a β-ketonic acid, a β-keto ester, an oxy-acid, a diol, a higher carboxylic acid, an alkanolamine, and a polyamine in a proportion of 0.2 to 3 mol per one mol of the total amount of metals in said composition.

* * * * *